(12) United States Patent
Oda et al.

(10) Patent No.: US 8,345,424 B2
(45) Date of Patent: Jan. 1, 2013

(54) OPTICAL INTERCONNECTION DEVICE

(75) Inventors: Mikio Oda, Tokyo (JP); Tomotaka Ishida, Tokyo (JP); Hisaya Takahashi, Tokyo (JP); Hideyuki Ono, Tokyo (JP); Jun Sakai, Tokyo (JP); Takashi Ohtsuka, Tokyo (JP); Arihide Noda, Tokyo (JP); Hikaru Kouta, Tokyo (JP)

(73) Assignee: NEC Corporation, Tokyo (JP)

( * ) Notice: Subject to any disclaimer, the term of this patent is extended or adjusted under 35 U.S.C. 154(b) by 130 days.

(21) Appl. No.: 12/865,780

(22) PCT Filed: Feb. 16, 2009

(86) PCT No.: PCT/JP2009/052550
§ 371 (c)(1),
(2), (4) Date: Aug. 9, 2010

(87) PCT Pub. No.: WO2009/104558
PCT Pub. Date: Aug. 27, 2009

(65) Prior Publication Data
US 2010/0328894 A1    Dec. 30, 2010

(30) Foreign Application Priority Data
Feb. 19, 2008 (JP) .................. 2008-036952

(51) Int. Cl.
*H05K 7/20* (2006.01)
(52) U.S. Cl. .... 361/699; 361/719; 257/714; 165/104.33
(58) Field of Classification Search .......... None
See application file for complete search history.

(56) References Cited

U.S. PATENT DOCUMENTS

| | | | |
|---|---|---|---|
| 6,018,465 A * | 1/2000 | Borkar et al. | 361/825 |
| 6,611,635 B1 * | 8/2003 | Yoshimura et al. | 385/14 |
| 6,679,315 B2 * | 1/2004 | Cosley et al. | 165/80.4 |
| 6,821,802 B2 * | 11/2004 | Ahn et al. | 438/27 |
| 7,154,751 B2 * | 12/2006 | Furuyama et al. | 361/704 |
| 7,286,346 B2 * | 10/2007 | Chiba et al. | 361/679.48 |
| 7,806,168 B2 * | 10/2010 | Upadhya et al. | 165/80.4 |

FOREIGN PATENT DOCUMENTS

| | | |
|---|---|---|
| JP | 9-44272 A | 2/1997 |
| JP | 2000294969 A | 10/2000 |
| JP | 2004226430 A | 8/2004 |
| JP | 2006059883 A | 3/2006 |
| JP | 2006294943 A | 10/2006 |
| JP | 2004104094 A | 4/2009 |

OTHER PUBLICATIONS

International Search Report for PCT/JP2009/052550 mailed May 19, 2009.

* cited by examiner

*Primary Examiner* — Boris Chervinsky (57) ABSTRACT

Provided is an optical interconnection device in which a volume required for cooling is reduced. In the optical interconnection device, a plurality of optical modules (12) are arranged on a periphery of an LSI (11) electrically connected to an electric wiring board (10), and liquid cooling mechanisms (13, 14) are respectively placed on the LSI (11) and the optical modules (12). The plurality of optical modules (12) may be arranged only on a surface of the electric wiring board (10) where the LSI (11) is mounted, only on a surface opposite to the surface where the LSI (11) is mounted, or on both the same surface as and the opposite surface to the surface where the LSI (11) is mounted.

15 Claims, 7 Drawing Sheets

PRIOR ART

OPTICAL INTERCONNECTION DEVICE

This application is the National Phase of PCT/JP2009/052550 filed Feb. 16, 2009, which is based upon and claims the benefit of priority from Japanese patent application No. 2008-159793 filed on Jun. 18, 2008, the disclosure of which is incorporated herein in its entirety by reference.

TECHNICAL FIELD

The present invention relates to the electronics field such as a network and a computer and, particularly, to the technical field of an optical interconnection device for conversion between an optical signal and an electrical signal.

BACKGROUND ART

Although large scale integration (LSI) devices LSIs are becoming increasingly faster, it is considered that there is a limit to the transmission capacity of an electrical line that connects between those LSIs or the like. As a technique to break through the limit, expectations are placed on an optical interconnection technique. The optical interconnection technique is a technique that uses an optical line instead of an electrical line used hitherto. Specifically, a configuration is being researched and developed that converts an electrical signal output from an LSI to an optical signal, transmits the signal over a desired distance by using an optical line such as an optical waveguide or an optical fiber and converts the optical signal to an electrical signal to thereby reach an input pin of a destination LSI.

A large number of, as many as 100 or more, input/output electrical terminals are attached to a high-performance LSI, and in the case of applying the optical interconnection technique, it is necessary to replace all electrical signals corresponding to that number of terminals with optical signals. Further, because a high-speed signal of about 10 Gbps undergoes a large loss in electrical line transmission, it is desirable to make conversion into an optical signal in the circumstances where a loss is as small as possible. In other words, an electrical line distance should be shorter. In order to convert the electrical signals corresponding to the large number of input/output electrical terminals to optical signals in the state where a loss in the electrical lines is small, it is important to place an optical module for opto-electric conversion in close proximity to the LSI.

In terms of heating, a heating value increases as the operating speed becomes higher in the above-described high-performance LSI and optical module. With the increase in heating value, the size of a cooling fin or the like for cooling becomes larger. It is desirable that a cooling structure is of like size to the size of the LSI or the optical module.

In the invention disclosed in Patent Document 1, an LSI package with an interface module using a socket is described. For example, in Patent Document 1, a cross-sectional view of an LSI package with an optical interface module is shown in FIG. 10. Note that FIG. 10 in Patent Document 1 is described as FIG. 12 in this specification.

Figure 12:
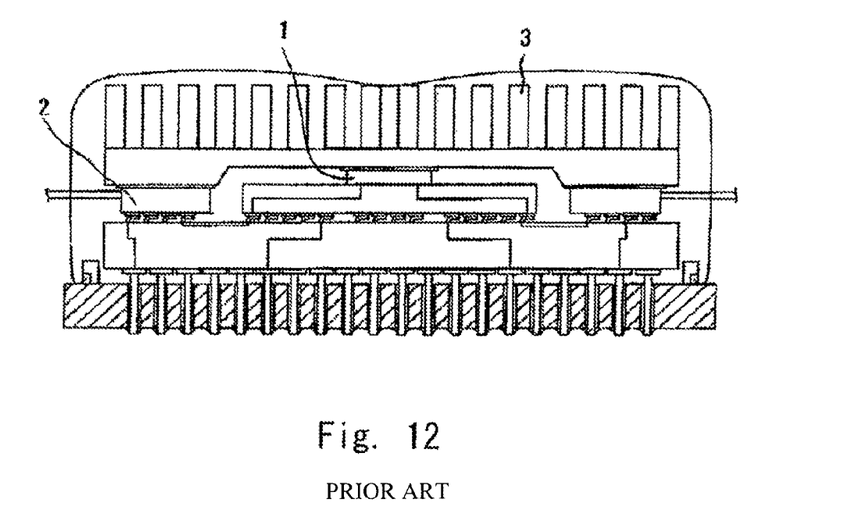
FIG. 12 is a schematic diagram showing an LSI package with an interface module according to prior art.

In FIG. 12, a signal processing LSI 1 and an optical interface module 2 are in contact with a heatsink 3. Although the description regarding FIG. 10 in Patent Document 1 refers simply to the heatsink, the detail of the heatsink is described as follows in the paragraph of the specification.

Specifically, it is described in the paragraph that "Further, as the frequency of a signal becomes higher, power consumption per terminal generally tends to increase. For example, in a CPU used for a personal computer or the like, there is an LSI that consumes as much as 70 to 80 W. In light of this, a structure is employed in which a heat spreader and a big heatsink are mounted on the signal processing LSI to enlarge a heat dissipation area and forced air cooling is performed by a fan or the like. On the other hand, as described earlier, because it is necessary to minimize the line length between the signal processing LSI and the interface module, mounting a heatsink for the signal processing LSI causes a lack of extra space for another head sink for the interface module". It is assumed from this description that air cooling is supposed for the above-described heatsink.

[Patent Document 1]
Japanese Unexamined Patent Application Publication No. 2009-59883

DISCLOSURE OF INVENTION

Technical Problem

However, an extremely high cooling capability is required for a product at high speed and with a very large number of signals. In the case of using an air cooling heatsink, it is not within the combined size of the LSI package and the interface as shown in FIG. 10 of Patent Document 1 but is a very large size (e.g. twice or greater), and it is not suitable as an electronic product for which a small size and high performance are demanded.

Further, even in the case where the heatsink is within the size shown in FIG. 10 of Patent Document 1, the problem of interference with the heatsink occurs when it is desired to perform input and output of optical signals in the up-and-down direction in the figure.

The present invention has been accomplished in view of the foregoing, and an object of the invention is thus to provide an optical interconnection device in which a volume required for cooling is reduced.

Technical Solution

To overcome the above concern, according to an aspect of an exemplary embodiment, a plurality of optical modules are arranged on a periphery of an LSI electrically connected to an electric wiring board, and liquid cooling mechanisms are respectively placed on the LSI and the optical modules.

According to an aspect of an exemplary embodiment, the plurality of optical modules are arranged only on a surface of the electric wiring board where the LSI is mounted.

According to an aspect of an exemplary embodiment, the plurality of optical modules are arranged only on a surface of the electric wiring board opposite to a surface where the LSI is mounted.

According to an aspect of an exemplary embodiment, the plurality of optical modules are arranged on both a surface of the electric wiring board where the LSI is mounted and a surface opposite to the surface.

According to an aspect of an exemplary embodiment, an optical input and output direction of the plurality of optical modules is in a perpendicular direction to the electric wiring board.

According to an aspect of an exemplary embodiment, an optical input and output direction of the plurality of optical modules is in a parallel direction to the electric wiring board.

According to an aspect of an exemplary embodiment, the plurality of optical modules are arranged in a dispersed manner on the electric wiring board.

According to an aspect of an exemplary embodiment, the liquid cooling mechanism of the LSI is a heatsink having micro-fins inside.

According to an aspect of an exemplary embodiment, a height adjustment member is interposed between the plurality of optical modules and the liquid cooling mechanism according to their heights.

According to an aspect of an exemplary embodiment, the plurality of optical modules are arranged separated into an optical module for optical transmission and an optical module for optical reception.

According to an aspect of an exemplary embodiment, an optical fiber connected to the optical module for optical transmission and an optical fiber connected to the optical module for optical reception are tied together in a bundle.

According to an aspect of an exemplary embodiment, when a component in need of air cooling exists in the device, a partition plate that blocks cooling wind to the optical fibers is placed.

According to an aspect of an exemplary embodiment, the liquid cooling mechanism for the LSI and the liquid cooling mechanism for the plurality of optical modules are integrated through a heat transfer plate.

According to an aspect of an exemplary embodiment, the liquid cooling mechanism and an optical fiber are connected to the plurality of optical modules.

Advantageous Effects

In the optical interconnection device according to the present invention, by using the liquid cooling mechanism as a cooling means, it is possible to reduce a volume required for cooling. This leads to an advantage that a product size can be reduced accordingly. Further, by placing the liquid cooling mechanism, the area occupied by the cooling structure in the optical module is reduced, so that either of the parallel direction or the perpendicular direction to the package can be selected for optical input and output. It is thus possible to achieve the optical interconnection device in which the cooling structure and the optical fiber for optical input and output do not interfere with each other.

EXPLANATION OF REFERENCE

10 ELECTRIC WIRING BOARD
11 LSI
12 OPTICAL MODULE
12a TRANSMISSION OPTICAL MODULE
12b RECEPTION OPTICAL MODULE
13 LIQUID COOLING HEATSINK
13a MICRO-FIN
14 LIQUID COOLING PIPE
15 COOLANT INLET AND OUTLET
16 OPTICAL INPUT/OUTPUT PART
17 FIXING PART
18 FIXING SCREW
19 HOLDING PLATE
20 HEIGHT ADJUSTMENT MEMBER
21 OPTICAL TRANSMISSION PATH
22 HEAT TRANSFER PLATE
23 OPTICAL FIBER
24 CASING
25 OPTICAL CONNECTOR

BEST MODE FOR CARRYING OUT THE INVENTION

Hereinafter, embodiments of the present invention are described in detail with reference to the drawings.

First Embodiment

Figure 1:
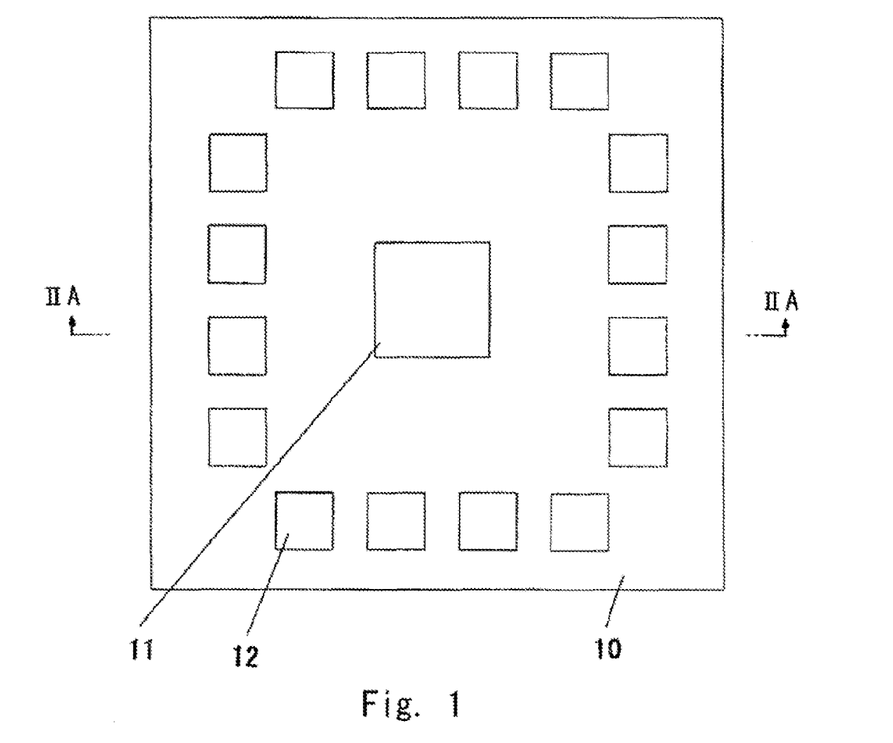
FIG. 1 is a plan view showing a first embodiment of an optical interconnection device according to the present invention.
Figure 2A:
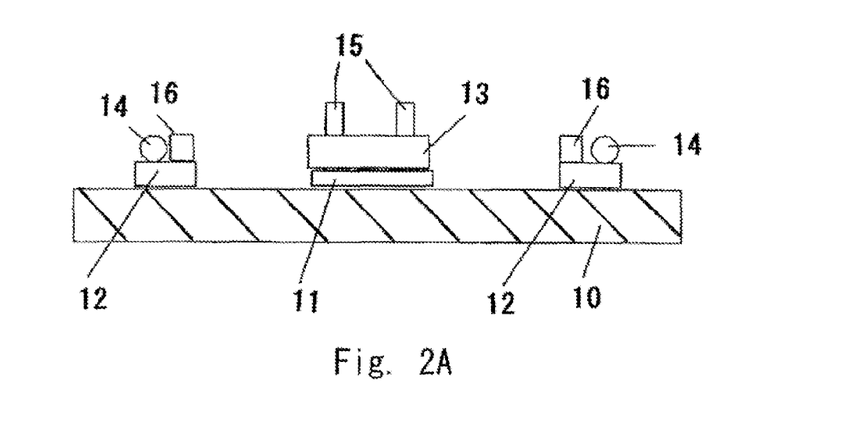
FIG. 2A is a cross-sectional view along line IIA-IIA in FIG. 1.
Figure 2B:
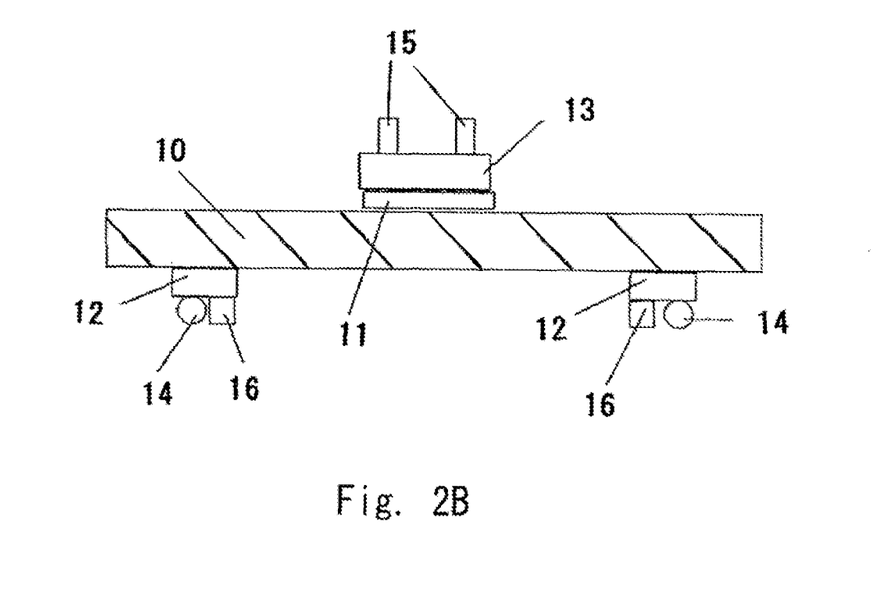
FIG. 2B is a cross-sectional view showing a first alternative example of the first embodiment of the optical interconnection device.
Figure 2C:
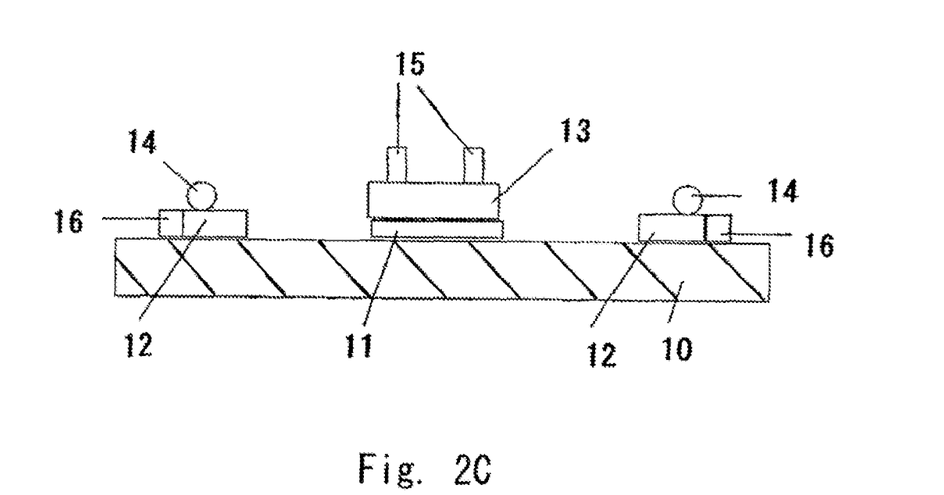
FIG. 2C is a cross-sectional view showing a second alternative example of the first embodiment of the optical interconnection device.

FIG. 1 is a plan view showing a first embodiment of an optical interconnection device according to the present invention, FIG. 2A is a cross-sectional view along line IIA-IIA in FIG. 1, FIG. 2B is a cross-sectional view showing a first alternative example of the first embodiment of the optical interconnection device, and FIG. 2C is a cross-sectional view showing a second alternative example of the first embodiment of the optical interconnection device. The first embodiment and its alternative examples show the case where optical modules are mounted only on one side (the same surface) of an electric wiring board.

As shown in FIG. 1, an LSI 11 and a plurality of optical modules 12 are mounted on an electric wiring board 10, and the plurality of optical modules 12 are arranged on the periphery of the LSI 11. Note that a printed board or a ceramic board is suited to the electric wiring board 10. In the embodiment shown in FIG. 1, the total sixteen optical modules 12 are mounted on the periphery of the four sides of one LSI 11. The number of optical modules 12 is just an example, and its number or the number of channels may be varied according to the purpose. The LSI 11 and the optical modules 12 are electrically connected to the electric wiring board 10 by a solder or a socket. The electrical connection structure is omitted in FIG. 1.

Further, in this embodiment, a liquid cooling heatsink 13 is mounted on the LSI 11 as a liquid cooling mechanism of about the same size as the LSI 11, and a liquid cooling pipe 14 is mounted on the optical module 12 as a liquid cooling mechanism of about half the size of its top face area, as shown in FIG. 2A. The liquid cooling heatsink 13 is provided with coolant inlet and outlet 15 for inputting and outputting (supplying and draining) a coolant, and the liquid cooling pipe 14 is provided with an inlet and an outlet of a coolant for liquid cooling, though not shown. Because the plurality of optical modules 12 are arranged dispersed in a rectangular shape (in a square shape in this embodiment), the liquid cooling pipe 14 can be arranged in a simple linear fashion along each side. Differently from such an arrangement of the optical modules 12, when the optical modules 12 have a complicated shape such as a staggered arrangement, the liquid cooling pipe 14 needs to have a complicated shape corresponding thereto. Note that, although not shown, the coolant inlet and outlet 15 of the liquid cooling heatsink 13 on the LSI 11 and the liquid cooling pipe 14 on the optical modules 12 are both connected to a pump and a radiator, so that a coolant circulates therethrough for cooling.

The optical modules 12 are configured such that light can be input and output in the up-and-down (perpendicular) direction with respect to the electric wiring board 10 in FIG. 2A. An optical input/output part 16 may have a detachable structure as an optical connector structure or may have an undetachable structure with an optical fiber called a pigtail attached thereto. In FIG. 2A, on both front and back sides of the electric wiring board 10, the surface where the optical modules 12 are mounted is the same surface as the LSI 11.

As another structure, as in the first alternative example shown in FIG. 2B, the optical modules 12 may be mounted on an opposite surface to the LSI 11 in the electric wiring board 10. In the case of the first alternative example shown in FIG. 2B, since the optical modules 12 are mounted on the opposite surface to the LSI 11, the liquid cooling pipe 14 is also placed on the side of the optical modules 12. Further, as in the second alternative example shown in FIG. 2C, the optical input/output part 16 may be placed on the side surface of the optical modules 12. In this case, the optical input/output part 16 of optical signals is placed in the parallel direction to the electric wiring board 10. Note that, in FIGS. 2B and 2C, the identical reference symbols are used for the identical elements to those in FIG. 2A.

The effects of the embodiment and the alternative examples are described hereinafter.

First, a flow of signals in the embodiment and the alternative examples is described.

The LSI 11 has a function of performing electrical input and output for a power supply and an operation part, and its electrical input/output terminals are connected to electrical lines in the electric wiring board 10. The electrical lines are connected to the optical input/output parts 16 of the optical modules 12. Specifically, an electrical input/output terminal of the LSI 11 is connected to an input terminal of the optical input/output part 16 in the optical module 12 for transmission through a line in the electric wiring board 10. An electrical signal that is output from the electrical input/output terminal of the LSI 11 passes through the path, is converted to an optical signal in the optical module 12, and transmitted from the optical input/output part 16 to the destination optical module 12 for reception through an optical fiber or the like. Reversely, an optical signal is transmitted to the optical module 12 for reception, and the optical signal is converted to an electrical signal in the optical module 12. The optical input/output part 16 of the optical module 12 is connected to the electrical input/output terminal of the LSI 11 through a line in the electric wiring board 10, and the output electrical signal from the optical module 12 for reception is transmitted to the LSI 11. Note that, an input/output optical fiber connected to the optical module 12 is omitted in FIGS. 1 to 2C.

Next, a cooling mechanism in the embodiment and the alternative examples is described.

The liquid cooling heatsink 13 for cooling the LSI 11 and the liquid cooling pipe 14 for cooling the optical modules 12 are both connected to a pump that circulates a coolant and a radiator that lowers the temperature of a coolant. The pump and the radiator are omitted in FIGS. 1 to 2C. The radiator has a structure in which the temperature of the radiator is lowered by application of wind from an air cooling fan, which is not shown, so that the temperature of a coolant passing through the radiator is lowered. If one circulating system is made up of both the liquid cooling heatsink 13 for cooling the LSI 11 and the liquid cooling pipe 14 for cooling the optical modules 12, it is possible to save the space of the cooling mechanism. When a large installation area is available, the respective cooling mechanisms may be configured separately.

Further, a manufacturing method in the embodiment and the alternative examples is described.

In the case of mounting both of the LSI 11 and the optical modules 12 on the electric wiring board 10 by using a solder, either one can be mounted first. For example, with use of a flip-chip mounter, the LSI 11 is mounted first, and the optical modules 12 are mounted after that. Then, the liquid cooling heatsink 13 for the LSI 11 and the liquid cooling pipe 14 for the optical modules 12 are respectively fixed onto the LSI 11 and the optical modules 12, thereby manufacturing a device capable of optical interconnection.

Further, in the case of mounting both of the LSI 11 and the optical modules 12 on the electric wiring board 10 by using a socket, the manufacturing method is as follows.

First, a socket for the LSI 11 and a socket for the optical modules 12 are mounted on the electric wiring board 10. Then, the LSI 11 and the optical modules 12 are inserted and fixed to the respective sockets, thereby allowing an electrical connection. Finally, the liquid cooling heatsink 13 for the LSI 11 and the liquid cooling pipe 14 for the optical modules 12 are respectively fixed onto the LSI 11 and the optical module 12, thereby manufacturing a device capable of optical interconnection. Note that, the heatsink for cooling may be fixed by using the method of fixing the LSI 11 and the optical modules 12 to the sockets.

Further, a manufacturing method in the case of mounting either one of the LSI 11 or the optical modules 12 by a solder and mounting the other one by a socket is as follows. As one example, the case of mounting the LSI 11 by a solder and mounting the optical modules 12 by a socket is described hereinbelow.

Because the high-temperature tolerance of a socket is generally low, after the LSI 11 is mounted by using a solder, the socket is fixed to the electric wiring board 10, and then the optical modules 12 are inserted and fixed to the socket. The order of attaching the cooling mechanisms is the same as in the above-described case.

As described above, several manufacturing methods can be employed.

In this manner, according to the embodiment and the alternative examples, the liquid cooling heatsink 13 is fixed onto the LSI 11, and the liquid cooling pipe 14 is fixed onto the optical module 12, thereby enabling reduction of a volume required for cooling. This leads to an advantage that the product size can be reduced accordingly. Further, by using the liquid cooling mechanism, the area occupied by the cooling structure in the optical module 12 is reduced, so that the optical input/output part 16 can be placed in either of the parallel direction or the perpendicular direction to the package. Thus, it is possible to achieve the optical interconnection device in which the cooling structure and the optical fiber for optical input and output do not interfere with each other.

Second Embodiment

Figure 3:
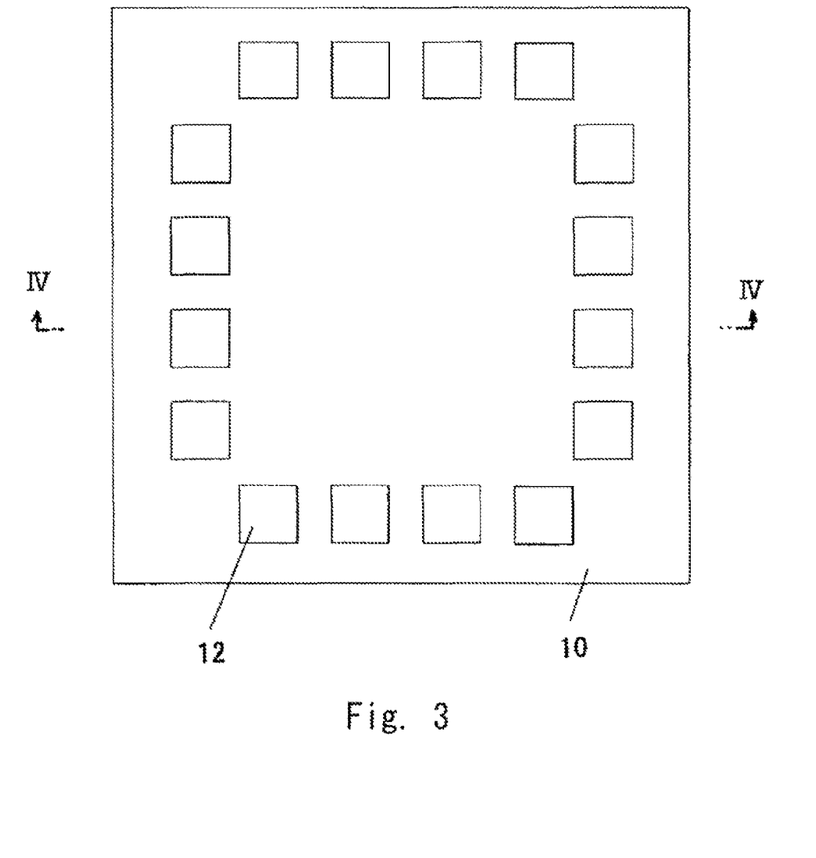
FIG. 3 is a bottom view showing a second embodiment of an optical interconnection device according to the present invention.
Figure 4:
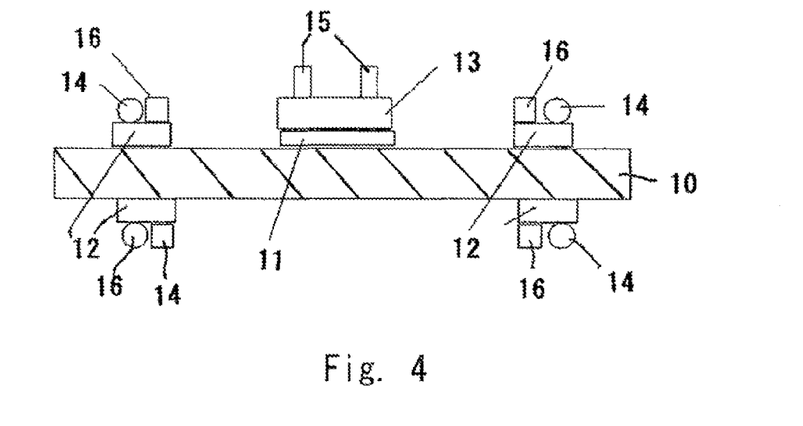
FIG. 4 is a cross-sectional view along line IV-IV in FIG. 3.

FIG. 3 is a bottom view showing a second embodiment of an optical interconnection device according to the present invention, and FIG. 4 is a cross-sectional view along line IV-IV in FIG. 3. The second embodiment shows the case where the optical modules are arranged on both sides of the electric wiring board. Further, the identical or equivalent elements to those of the first embodiment are denoted by the identical reference symbols. The same applies to the subsequent embodiments.

In this embodiment, a plurality of optical modules 12 are mounted on both of the same surface as and the opposite surface to the surface of the electric wiring board 10 where the LSI 11 is mounted.

As shown in FIG. 4, on the surface of the electric wiring board 10 where the LSI 11 is mounted (which is referred to hereinafter as the front surface), sixteen optical modules are arranged on the periphery of the LSI 11 in the same manner as in FIG. 1. Further, as shown in FIG. 3, on the surface of the electric wiring board 10 where the LSI 11 is not mounted (which is referred to hereinafter as the back surface), sixteen optical modules are arranged.

The LSI 11 and the optical modules 12 in FIG. 1 are such that the LSI 11 and the optical modules 12 are electrically connected through lines in the electric wiring board 10 as described in the first embodiment. Likewise, the optical modules 12 in FIG. 4 are also electrically connected to the LSI 11 on the front surface through electrical lines including a via hole in the electric wiring board 10.

Further, as shown in FIG. 4, the liquid cooling pipe 14 and the optical input/output part 16 are attached to all of the optical modules 12 arranged on both the front and back surfaces. In this manner, in the case where the number of inputs and outputs of the LSI 11 is large and it is necessary to mount a large number of optical modules 12 corresponding thereto, the structure in which the optical modules 12 are mounted on both surfaces of the electric wiring board 10 as in this embodiment is suitable.

Note that both of the optical modules 12 on the front surface and the optical modules 12 on the back surface are provided for optical interconnection of input and output signals of the LSI 11, thus having the same function as in the first embodiment described above. Further, a manufacturing method of this embodiment is the same as that of the first embodiment described above, and an explanation thereof is omitted.

Third Embodiment

Figure 5:
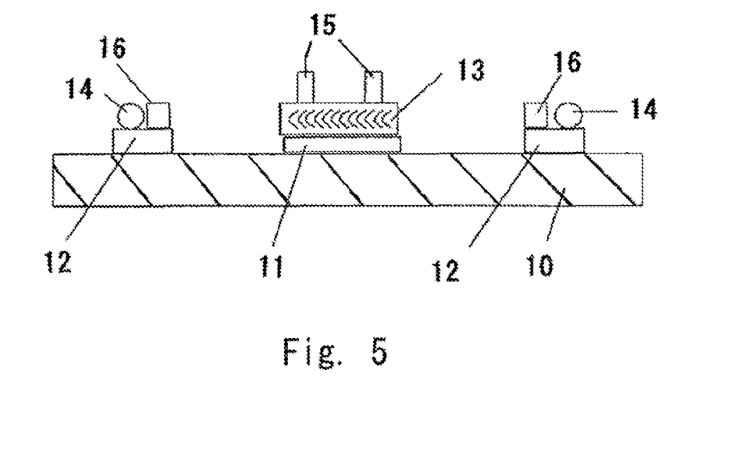
FIG. 5 is a cross-sectional view showing a third embodiment of an optical interconnection device according to the present invention.
Figure 6:
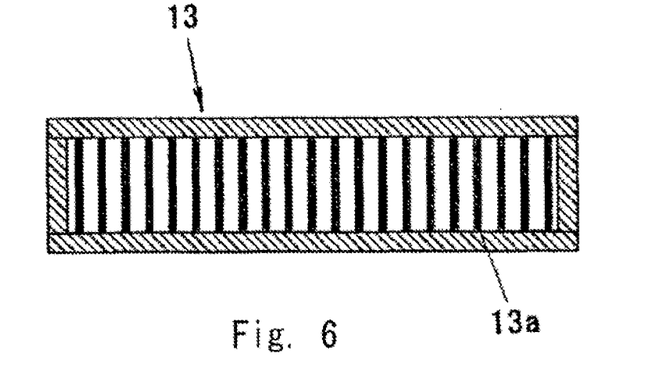
FIG. 6 is an enlarged cross-sectional view showing a liquid cooling heatsink of FIG. 5.

FIG. 5 is a cross-sectional view showing a third embodiment of an optical interconnection device according to the present invention, and FIG. 6 is an enlarged cross-sectional view showing a liquid cooling heatsink of FIG. 5. In the third embodiment, micro-fins are placed inside the liquid cooling heatsink 13 for the LSI 11.

As shown in FIG. 5 and FIG. 6, in this embodiment, micro-fins 13a are placed inside the liquid cooling heatsink 13 for the LSI 11. Specifically, a large number of micro-fins 13a, which are micro-protrusions, are arranged at regular intervals in a part through which a coolant flows inside the liquid cooling heatsink 13.

Thus, in this embodiment, by incorporating the micro-fins 13a, the contact area between a coolant and the liquid cooling heatsink 13 increases, and the rate of flow of a coolant flowing between the micro-fins 13a also increases, so that it is possible to improve a cooling capability and, consequently, to downsize the liquid cooling heatsink 13. As a result of downsizing the liquid cooling heatsink 13 of the LSI 11, an advantage that the optical modules 12 can be mounted closer to the LSI 11 is obtained.

Fourth Embodiment

Figure 7:
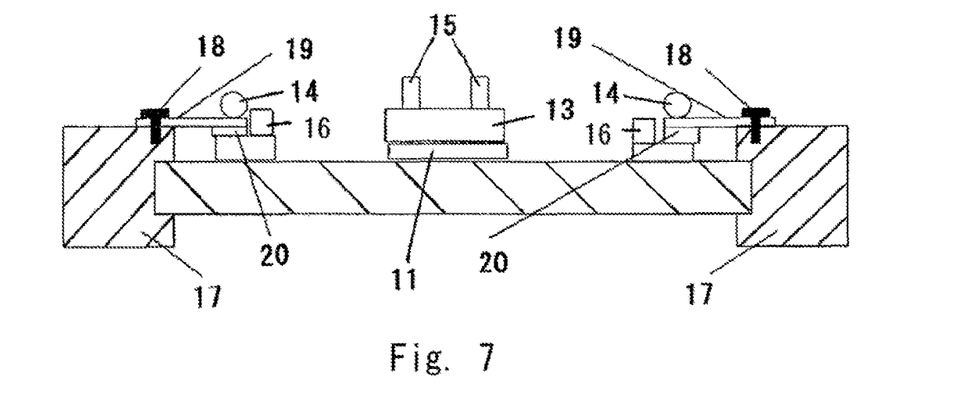
FIG. 7 is a cross-sectional view showing a fourth embodiment of an optical interconnection device according to the present invention.

FIG. 7 is a cross-sectional view showing a fourth embodiment of an optical interconnection device according to the present invention. In the fourth embodiment, a height adjustment member is placed between the liquid cooling pipe and the optical module.

As shown in FIG. 7, a plurality of optical modules 12 are mounted on the electric wiring board 10. In practice, the height of the top surfaces of the respective optical modules 12 is not completely uniform but varies. FIG. 7 shows an exaggerated illustration so that the variation of the height can be clearly recognized, in which the height of the optical module after mounted on the right of FIG. 7 is relatively low, and the height of the optical module after mounted on the left is relatively high.

As shown in FIG. 7, both ends of the electric wiring board 10 are fixed by a fixing part 17, and a holding plate 19, which is a flat plate, is fixed on top of the fixing part 17 by a fixing screw 18. The holding plate 19 holds a height adjustment member 20 so as to bring the liquid cooling pipe 14 into thermal contact with the optical modules 12.

In the case of making thermal contact with the optical modules 12 directly with use of the holding plate 19, because the holding plate 19 is flat but the height of the optical modules 12 after mounted varies, the situation occurs where thermal contact can be satisfactorily made with some optical modules 12 but thermal contact is not satisfactory with other optical modules 12. Under such a situation, the objective of cooling all of the optical modules 12 is not attained.

In light of that, in this embodiment, a deformable member with a high thermal conductivity such as a compound is interposed as the height adjustment member 20 between the holding plate 19 and the optical modules 12 as described above, so that thermal contact can be made uniformly between the liquid cooling pipe 14 and all of the optical modules 12, thereby enabling suitable cooling of the optical modules 12.

Fifth Embodiment

Figure 8:
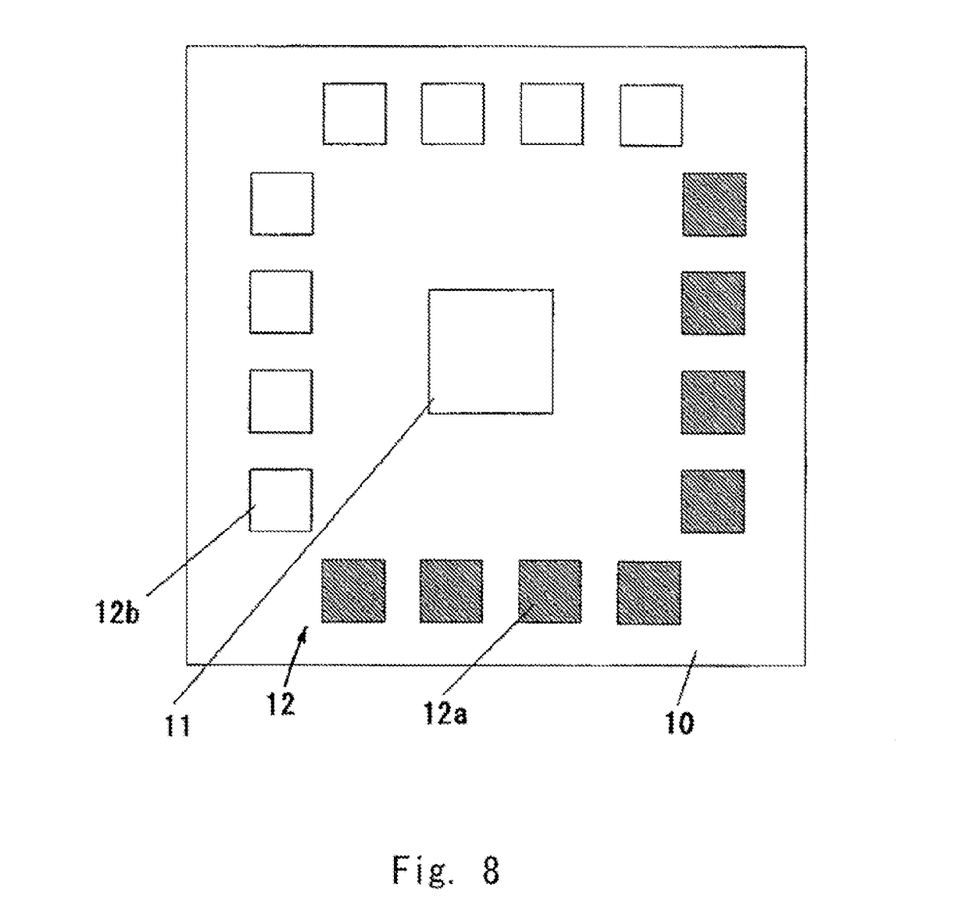
FIG. 8 is a plan view showing a fifth embodiment of an optical interconnection device according to the present invention.

FIG. 8 is a plan view showing a fifth embodiment of an optical interconnection device according to the present invention. In the fifth embodiment, optical modules for transmitting light and optical modules for receiving light are placed separately.

As shown in FIG. 8, the LSI 11 and the optical modules 12 are mounted on the electric wiring board 10. Among the optical modules 12, those with diagonal lines are transmission optical modules 12a, and those with no diagonal line and shown in white are reception optical modules 12b.

Typically, the voltage level of an output signal of the LSI 11 is high, and the output signal is electrically connected to the transmission optical module 12a. On the other hand, the voltage level of a signal input to the LSI 11 is attenuated to a low voltage. Therefore, if the input signal is placed in close proximity to the output signal, the input signal with a low voltage level is easily affected by the output signal with a high voltage level, which results in the occurrence of a noise.

Further, the light intensity of an optical output signal is high and the light intensity of an optical input signal is low in the optical modules 12 as well. In this case also, like the case of an electrical signal, if the optical input signal with a low light intensity is placed in close proximity to the optical output signal with a high light intensity, the optical input signal is easily affected by the optical output signal, which leads to the occurrence of a noise.

In order to overcome the above concern, the structure shown in FIG. 8 is applicable. Specifically, in this embodiment, the output of electrical signals and the output of optical signals are arranged in a certain area in a concentrated manner, and the input of electrical signals and the input of optical signals are arranged in another area. Thus, with the structure as shown in FIG. 8, it is possible to reduce the influence of output signals exerted on input signals.

Sixth Embodiment

Figure 9:
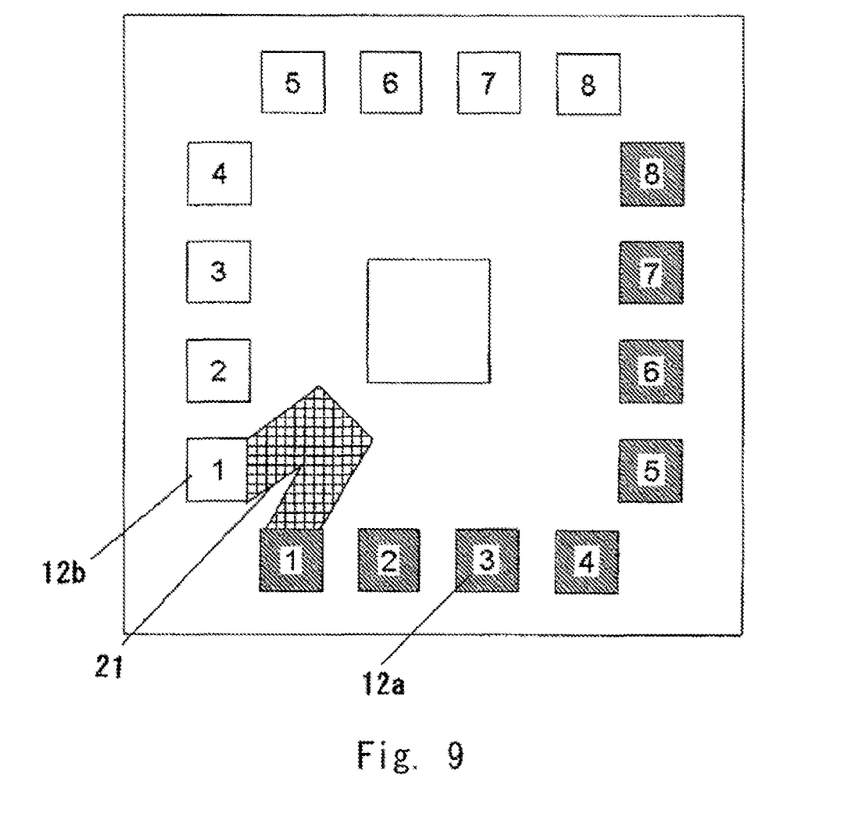
FIG. 9 is a plan view showing a sixth embodiment of an optical interconnection device according to the present invention.

FIG. 9 is a plan view showing a sixth embodiment of an optical interconnection device according to the present invention. In the sixth embodiment, optical fibers of the transmission optical module 12a and the reception optical module 12b are tied together in a bundle.

In the sixth embodiment shown in FIG. 9, in addition to the structure of the fifth embodiment shown in FIG. 8, optical fibers that transmit an optical output from one transmission optical module 12a and an optical input from one reception optical module 12b are tied together in a bundle. In FIG. 9, a reference symbol 21 indicates an optical transmission path.

In FIG. 9, the numbers 1 to 8 assigned to the transmission optical modules 12a and the reception optical modules 12b correspond to output and input ports in the LSI 11. For example, an electrical signal output from the output port "1" of the LSI 11 is converted to an optical signal in "1" of the transmission optical module 12a and then optically transmitted. Further, an optical signal input to "1" of the reception optical module 12b is converted to an electrical signal and input to the input port "2" of the LSI 11.

In this manner, in this embodiment, the optical fibers of the transmission optical module 12a and the reception optical module 12b are tied together in a bundle, thus having an advantage of easier construction of the device from the system side.

Seventh Embodiment

In the seventh embodiment, signal quality is stabilized by avoiding application of wind to optical fibers in the case of liquid cooling.

As shown in FIG. 9, in the seventh embodiment, optical fibers are used for transmitting optical input and output from the optical modules 12. In this structure, because liquid cooling is used, cooling is made by a liquid passing through a cooling path, and it is not necessary to send out wind from a fan like the case of air cooling. In the case of liquid cooling, wind is not applied to optical fibers, so that the optical fibers can be fixed without swinging. In the optical fibers that are fixed without swinging, optical signals with stable quality can be transmitted.

On the other hand, in the case of cooling the optical modules or the LSI with use of air cooling, wind is applied to optical fibers, and the optical fibers thereby swing. Since the optical fibers swing, optical signals in the optical fibers are not stabilized. For example, in the case of multimode optical transmission, the order of the mode of an optical signal to be transmitted varies, which consequently raises a problem of being incapable of controlling jitter of the optical signal.

Note that, in the case where liquid cooling is used for the LSI 11 and the optical modules 12 but air cooling needs to be used for the other parts, a structure that shields the optical fibers from the wind for air cooling with use of a partition plate or the like for windbreak may be employed.

Eighth Embodiment

Figure 10:
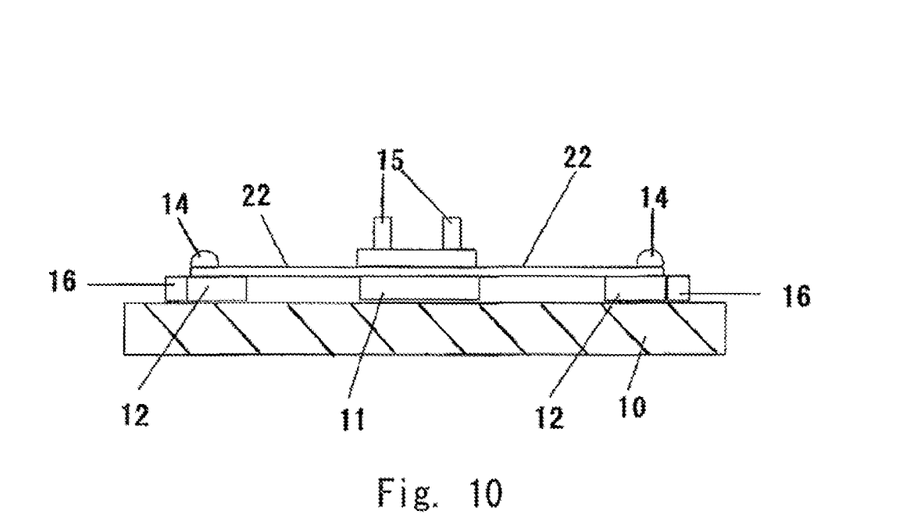
FIG. 10 is a cross-sectional view showing an eighth embodiment of an optical interconnection device according to the present invention.

FIG. 10 is a cross-sectional view showing an eighth embodiment of an optical interconnection device according to the present invention. In the eighth embodiment, the LSI 11 and the heatsink of the optical module 12 are integrated.

As shown in FIG. 10, in this embodiment, the liquid cooling heatsink 13 for the LSI 11 and the liquid cooling pipe 14 for the optical modules 12 are connected by a heat transfer plate 22 with a good thermal conductivity such as a copper plate. In this manner, because the heat transfer plate 22 that connects the liquid cooling heatsink 13 for the LSI 11 and the liquid cooling pipe 14 for the optical modules 12 is formed as an integral part, it is easy to attach and detach the heatsink for the LSI 11 and the optical modules 12.

Note that, in FIG. 10, the heatsink having a uniform height so that thermal contact can be made with the LSI 11 and the optical modules 12 when the thickness of the LSI 11 and the thickness of the optical modules 12 are the same is described. Alternatively, when the heights of the LSI 11 and the optical modules 12 are different, cooling of the both can be made by setting different levels to the respective heatsink heights.

Ninth Embodiment

Figure 11:
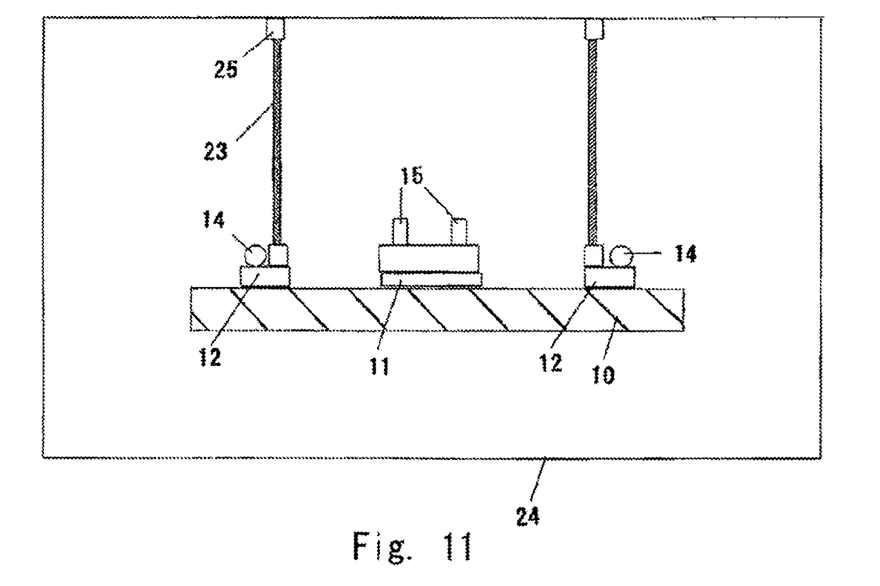
FIG. 11 is a cross-sectional view showing a ninth embodiment of an optical interconnection device according to the present invention.

FIG. 11 is a cross-sectional view showing a ninth embodiment of an optical interconnection device according to the present invention. In the ninth embodiment, both of optical fibers and cooling are taken into consideration.

As shown in FIG. 11, in this embodiment, one end of an optical fiber 23 is connected to the optical module 12, and the other end of the optical fiber 23 is fixed to a casing 24. An optical connector 25 fixed to the casing 24 in this manner can be optically connected to the outside.

In the optical interconnection device, it is necessary to perform both of cooling a plurality of optical modules 12 and connecting the optical fiber 23 to the plurality of optical modules 12. Because the liquid cooling technique is used in the embodiment shown in FIG. 11, it is possible to downsize the structure of a cooling unit and, consequently, to make a space for connecting the optical fiber 23 to the optical modules 12.

Note that, although the example of pulling the optical fiber out in the crosswise direction when the heatsink is large is disclosed in related art, it is considered that the heatsink lies in the way in some cases when pulling the optical fiber out in the lengthwise direction.

Although the present invention is described above by referring to the embodiments, the present invention is not limited to the above-described embodiments. Various changes and modifications as would be obvious to one skilled in the art may be made to the structure and the details of the present invention without departing from the scope of the invention.

This application is based upon and claims the benefit of priority from Japanese patent application No. 2008-159793 filed on Jun. 18, 2008, the disclosure of which is incorporated herein in its entirety by reference.

Industrial Applicability

The present invention relates to a device for conversion between an optical signal and an electrical signal and is applicable to a variety of devices, systems and methods in the electronics field such as a network and a computer.

The invention claimed is:

1. An optical interconnection device wherein a plurality of optical modules are arranged on a periphery of a large scale integration device (LSI) electrically connected to an electric wiring board, and liquid cooling mechanisms are respectively placed on the LSI and the optical modules.

2. The optical interconnection device according to claim 1, wherein the plurality of optical modules are arranged only on a surface of the electric wiring board where the LSI is mounted.

3. The optical interconnection device according to claim 1, wherein the plurality of optical modules are arranged only on a surface of the electric wiring board opposite to a surface where the LSI is mounted.

4. The optical interconnection device according to claim 1, wherein the plurality of optical modules are arranged on both a surface of the electric wiring board where the LSI is mounted and a surface opposite to the surface.

5. The optical interconnection device according to claim 1, wherein an optical input and output direction of the plurality of optical modules is in a perpendicular direction to the electric wiring board.

6. The optical interconnection device according to claim 1, wherein an optical input and output direction of the plurality of optical modules is in a parallel direction to the electric wiring board.

7. The optical interconnection device according to claim 1, wherein the plurality of optical modules are arranged in a dispersed manner on the electric wiring board.

8. The optical interconnection device according to claim 1, wherein the liquid cooling mechanism of the LSI is a heatsink having micro-fins inside.

9. The optical interconnection device according to claim wherein a height adjustment member is interposed between the plurality of optical modules and the liquid cooling mechanism according to their heights.

10. The optical interconnection device according to claim 1, wherein the plurality of optical modules are arranged separated into an optical module for optical transmission and an optical module for optical reception.

11. The optical interconnection device according to claim 10, wherein an optical fiber connected to the optical module for optical transmission and an optical fiber connected to the optical module for optical reception are tied together in a bundle.

12. The optical interconnection device according to claim 1, wherein the liquid cooling mechanism for the LSI and the liquid cooling mechanism for the plurality of optical modules are integrated through a heat transfer plate.

13. The optical interconnection device according to claim 1, wherein the liquid cooling mechanism and an optical fiber are connected to the plurality of optical modules.

14. The optical interconnection device according to claim 1, wherein the plurality of optical modules are arranged dispersed in a rectangular shape, and
a liquid cooling pipe is arranged in a linear fashion to be in contact with each of the plurality of optical modules.

15. The optical interconnection device according to claim 9, wherein the height adjustment member is deformable.

* * * * *